United States Patent [19]
Morita et al.

[11] Patent Number: 5,585,292
[45] Date of Patent: Dec. 17, 1996

[54] METHOD OF FABRICATING A THIN FILM TRANSISTOR

[75] Inventors: Tatsuo Morita, Soraku-gun, Japan; Robert J. Markunas, Chapel Hill, N.C.

[73] Assignees: Sharp Kabushiki, Japan; Research Triangle Institute, Research Triangle Park, N.C.

[21] Appl. No.: 383,494

[22] Filed: Feb. 3, 1995

[51] Int. Cl.$^6$ .................................... H01L 21/265
[52] U.S. Cl. ..................... 437/407; 437/41; 437/42; 437/978
[58] Field of Search .......................... 437/40, 41, 978, 437/42

[56] References Cited

U.S. PATENT DOCUMENTS 5,412,493  5/1995  Kunii .................. 359/59

FOREIGN PATENT DOCUMENTS 65274  3/1990  Japan .

OTHER PUBLICATIONS

Batra et al "Development of Polysilicon TFT's for 16MB SRAM'S and Beyond" IEEE Trans. on Elect. Devices V40, No. 11, Nov. 1993 pp. 2125–2126.

Primary Examiner—Charles L. Bowers, Jr.
Assistant Examiner—Trung Dang
Attorney, Agent, or Firm—Nixon and Vanderhye

[57] ABSTRACT

A thin film transistor comprises an insulator interposed between a gate electrode and a polycrystalline silicon semiconductor layer, with the polycrystalline silicon semiconductor layer having a source region and a drain region with a channel between the source region and the drain region. The insulator comprises an ONO structure having an interfacial oxide layer in contact with the polycrystalline silicon semiconductor layer, a cap oxide layer in contact with the gate electrode, and a nitride layer interposed between the interfacial oxide layer and the nitride layer.

10 Claims, 2 Drawing Sheets

Fig. 3 PRIOR ART
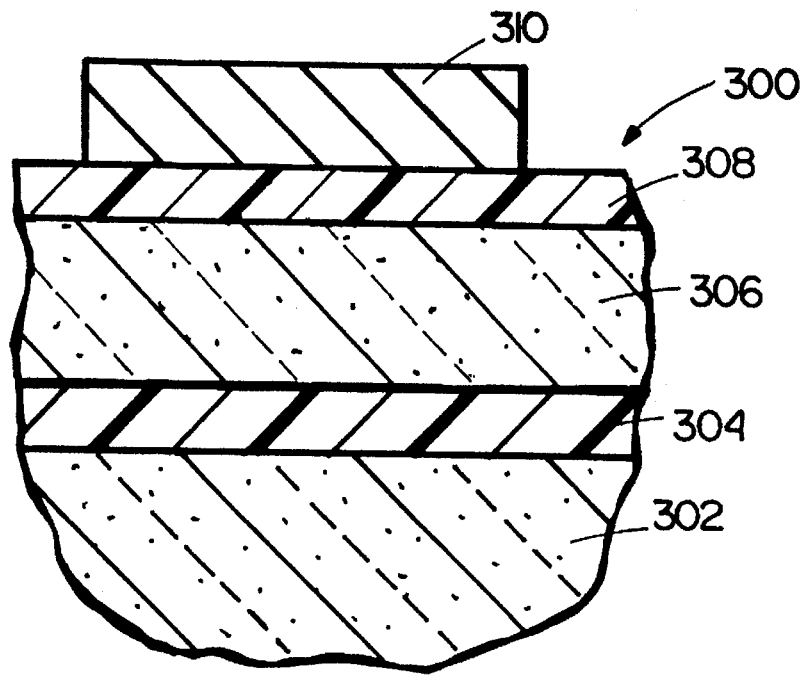
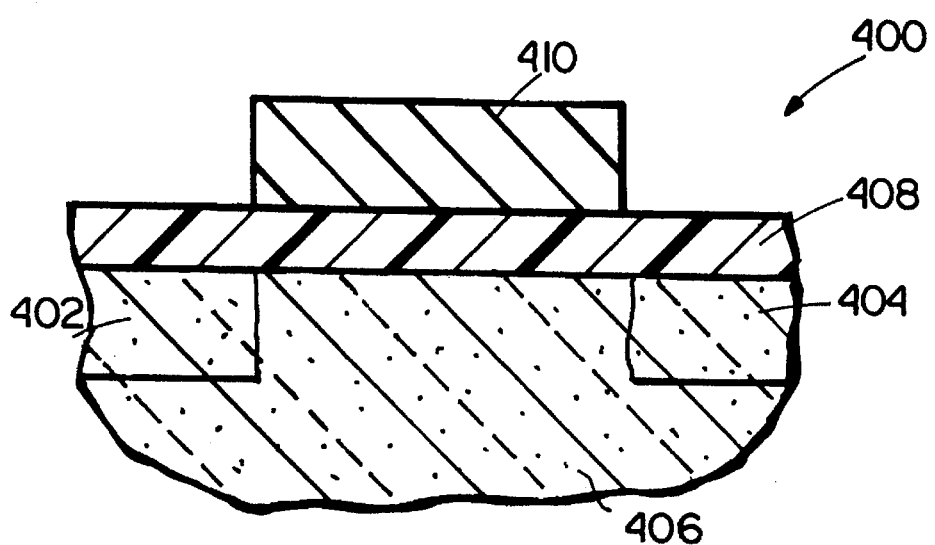
Fig. 4 PRIOR ART

5,585,292

METHOD OF FABRICATING A THIN FILM TRANSISTOR

BACKGROUND

1. Field of Invention

This invention pertains to thin film transistors and methods of fabrication thereof.

2. Related Art and Other Considerations

Heretofore it has been recognized that semiconductor memory devices operate in a certain mode that make it advantageous to employ an O-N-O structure. FIG. 3 shows a semiconductor memory device 300 comprising a single crystalline silicon semiconductor 302 covered with the following layers (in ascending order): a thin layer 304 of $SiO_2$; a layer 306 of $Si_3N_4$, and a second layer 308 of $SiO_2$. A metal 310 is formed on the uppermost $SiO_2$ layer 308 for serving as a gate of the memory device. It is the juxtaposition of the three layers of $SiO_2$, $Si_3N_4$, $SiO_2$ that evokes the terminology "O-N-O".

In operation, in an O-N-O-utilizing semiconductor memory device it is desired that electrons from the single crystalline substrate 302 tunnel through $SiO_2$ layer 304 and get trapped in the nitride layer (i.e., layer 306 of $Si_3N_4$) when a predetermined voltage is applied to the gate metal 310. Consistent with this operation, $SiO_2$ layer 304 is formed to be no more than a tunnel thickness thick (e.g., on the order of about 15 Angstroms). In operation of the memory device, the trapped charge in the $Si_3N_4$ layer 306 acts according to the charge on gate metal 310.

In the aforedescribed manner, a bit of a semiconductor memory can be turned "on" or "off", and in the course of operation is switched many times between an "on" and "off" status. The repeated switching causes repeated electron tunneling through $SiO_2$ layer 304. A figure of merit in the evaluation of semiconductor memories is the number of times the memory can switch before it ceases to act reliably. Such a memory can cease to function reliably if electrons tunneling through $SiO_2$ layer 304 cause damage to $SiO_2$ layer 304. Such damage is particularly prone when $SiO_2$ layer 304 is experiencing strain.

It has been recognized that controlling the thickness of $Si_3N_4$ layer 306 can lessen susceptibility of the $SiO_2$ layer 304 to damage. In this regard, while the O-N interface (i.e., the interface at $SiO_2$ layer 304 and $Si_3N_4$ layer 306) serves to trap electrons, the remaining thickness of $Si_3N_4$ layer 306 influences the reliability of the memory by providing a mechanical effect that lessens susceptibility of $SiO_2$ layer 304 to strain damage. Hence the advantage of employing O-N-O structure in a semiconductor memory.

Electron travel in a thin film transistor ("TFT") is completely different from the typical memory as described above. A conventional thin film transistor 400 is shown in FIG. 4 as having a source region 402 and a drain region 404 formed in a polycrystalline silicon semiconductor layer 406. A gate oxide ($SiO_2$) layer 408 overlies substrate 406 with its source region 402 and drain region 404. A gate 410 is formed on gate oxide 408. In conventional TFTs, gate oxide layer 408 is typically between 90 to 100 Angstroms thick.

In the normal operation of a TFT, electrons travel from source region 402 to drain region 404. In contrast to the memory devices described above, in normal operation electrons do not tunnel through $SiO_2$ layer 408 and accordingly $SiO_2$ layer 408 is not considered to experience tunneling damage during normal operation. Thus, whereas normal operation of a memory device can be destructive to $SiO_2$ layer 304, $SiO_2$ layer 408 of a TFT is not prone to destruction during normal operation.

SUMMARY

A thin film transistor comprises an insulator interposed between a gate electrode and a polycrystalline silicon semiconductor layer, with the polycrystalline silicon semiconductor layer having a source region and a drain region with a channel between the source region and the drain region. The insulator comprises an ONO structure having an interfacial oxide layer in contact with the polycrystalline silicon semiconductor layer, a cap oxide layer in contact with the gate electrode, and a nitride layer interposed between the interfacial oxide layer and the nitride layer. The interfacial oxide layer and the cap oxide layer are preferably $SiO_2$; the nitride layer is preferably $Si_3N_4$. The interfacial oxide layer and the nitride layer have a thickness ratio which precludes electron trap formation at the interface of the polycrystalline silicon and the interfacial oxide. In particular, the interfacial oxide layer, the nitride layer, and the cap oxide layer have a thickness ratio of 10:5:85.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 3 is a cross-sectional view of a semiconductor memory device.

FIG. 4 is a cross-sectional view of a conventional TFT.

DETAILED DESCRIPTION OF THE PREFERRED EMBODIMENTS

Figure 1:
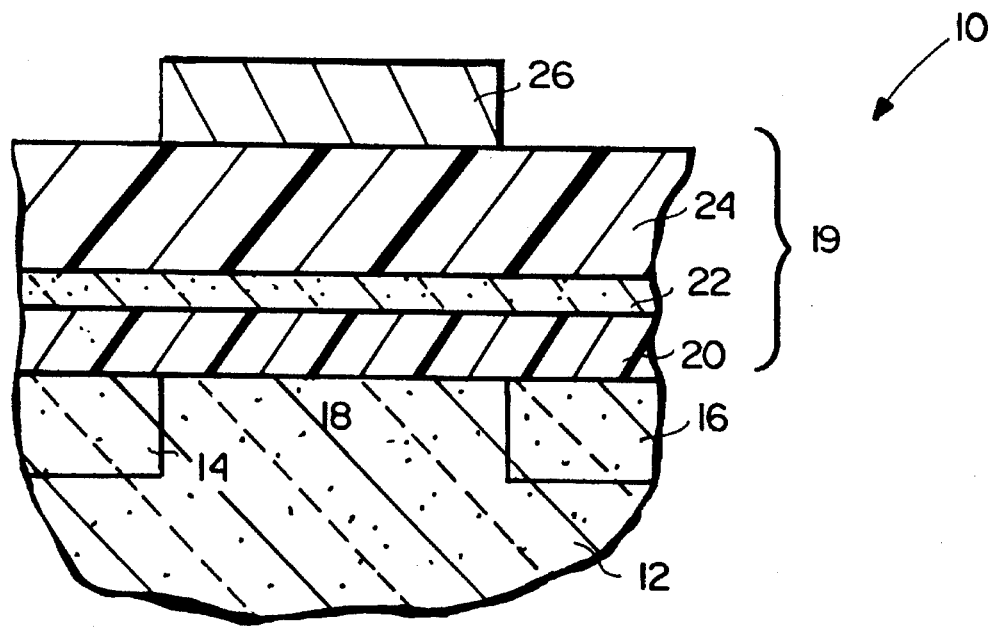
FIG. 1 is a cross-sectional view of a TFT having an ONO insulator according to a first embodiment of the invention.

In contrast to the single crystalline silicon substrates employed in memory chips, the inventors have discovered that polycrystalline silicon substrates employed in TFTs are highly susceptible to damage at an oxide-polycrystalline silicon interface when the interface is stressed.

The inventors discovered that a polycrystalline wafer is considerably more susceptible to surface damage during plasma operations (e.g., thin film deposition, e.g., insulator deposition) than is a single crystal silicon wafer. This surface damage susceptibility of polycrystalline silicon is now understood in terms of atomic orientations and bond strain. In this regard, whereas single crystal silicon has a narrow distribution of atomic orientations (i.e., highly predictable and essentially uniform positions of the atoms), polycrystalline shows much variation (i.e., multiple orientations) particularly at its surface. Importantly, some of the atoms at the polycrystalline surface are in a very high state of strain locally. When energetic bombardment characteristic of conventional plasma systems is applied to such already-strained atoms, bonds break and reform as a defect. The defects are manifested in the performance of the semiconductor devices. In view of the discovery of surface damage susceptibility of polycrystalline silicon, the inventors sought to move the plasma (with its kinetically energetic species) away from the polycrystalline silicon using a remote plasma configuration.

The inventors have also developed semiconductor (including TFT) fabrication techniques which have numerous advantageous, but which have a trade-off of potentially building stress into an oxide-polycrystalline silicon interface. For example, according to one technique, a gate oxide is formed to a thickness of 800 to 1000 Angstroms (e.g., 8 to 10 times thicker than conventional) in a low temperature process. In this respect, see U.S. patent application Ser. No. 08/383,495, filed Feb. 13, 1995 entitled "LINE PLASMA VAPOR PHASE DEPOSITION APPARATUS AND METHOD", which is incorporated herein by reference. Although a low temperature process has considerable benefit, it does not offer an annealing-out of stress as occurs in high temperature processes.

Thus, in contrast with prior art TFTs, the inventors' fabrication techniques for a TFT engender a relatively large strain field between the deposited oxide ($SiO_2$) and the easily-damaged polycrystalline silicon.

For reliability testing (as opposed to normal operation), TFTs are typically operated (in the reliability test mode only) to inject (e.g., tunnel) electrons into the insulator (i.e., gate oxide) by applying a large electric field between the gate and the channel of the TFT. In such testing, electrons travel through the insulator to the gate, setting up a current flow through the insulator. Since prior art TFTs are not under a large strain field (e.g., by reason of being fabricated at annealing high temperatures), the TFT is not damaged. However, without the benefit of the present invention, TFTs with a relatively large strain field may be damaged by such reliability testing. In this regard, tunneling of an electron may result in breakage of a strained bond (e.g., an electrical event triggering a chemical event) which results in trapping of electrons at the interface. Such trapping, albeit only occasioned by reliability testing and not by normal operation, can influence performance (e.g., linearity and mobility) of the TFT.

To mitigate a relatively large strain field between the deposited oxide ($SiO_2$) and the easily-damaged polycrystalline silicon, the inventors have developed an O-N-O insulator structure for use in TFTs. For example, FIG. 1 shows a thin film transistor 10 according to a first embodiment of the invention. TFT 10 has a polycrystalline silicon semiconductor layer 12 formed on an unillustrated substrate. Polycrystalline silicon layer 12 has source region 14 and drain region 16 formed therein using conventional techniques, with a channel region 18 extending therebetween. An ONO insulator structure 19 is provided on polycrystalline silicon layer 12. Particularly, an interfacial oxide layer 20 overlies polycrystalline silicon layer 12 (including source region 14 and drain region 16). Interfacial oxide layer 20 is in turn overlaid by nitride layer 22, which in turn is overlaid by cap oxide layer 24, also known as gate oxide 24. A metallic gate 26 is formed on cap oxide layer 24.

In the illustrated embodiment, interfacial oxide layer 20 and cap oxide layer 24 are preferably $SiO_2$ layers, and nitride layer 22 is preferably a $Si_3N_4$ layer.

Concerning fabrication, source region 14 and drain region 16 are formed in polycrystalline silicon layer 12 according to known techniques. Each of the three layers 20, 22, and 24 comprising ONO insulator structure 19 are formed in a plasma reactor using a CVD method. The plasma reactor introduces an excitable gas up-stream from its plasma and a reaction gas down-stream from its plasma. Layers 20, 22, and 24 are deposited in the plasma reactor in three distinct CVD operations, with the CVD operations being conducted under the conditions set forth in TABLE I. A ten minute pump down occurred between deposition of layer 20 and deposition of layer 22.

TABLE I

| Layer | Interfacial Oxide | Nitride | Cap Oxide (Gate Oxide) |
|---|---|---|---|
| Up-stream plasma (excitable) gas flow | 200 sccm 20% Oxygen in Helium | 300 sccm Argon | 200 sccm 20% Oxygen in Helium |
| down-stream (reaction) gas flow | 50 sccm 2% silane in Helium | 10 sccm 2% silane in Helium, 50 sccm nitrogen | 50 sccm 2% silane in Helium |
| reactor pressure | 100 mTorr | 100 mTorr | 100 mTorr |
| reactor power | 150 Watts plasma power | 100 Watts plasma power | 150 Watts plasma power |
| sample temperature | 300° C. | 300° C. | 300° C. |
| deposition time | 5 minutes | 14 minutes | 5 minutes |
| Layer thickness | 100 Angstroms | 50 Angstroms | 850 Angstroms |

Thus, interfacial oxide layer 20 and nitride layer 22 have a thickness ratio of 2:1. Considering ONO insulator structure 19 overall, interfacial oxide layer 20, nitride layer 22, and cap oxide layer 24 have a thickness ratio of 10:5:85.

Figure 2:
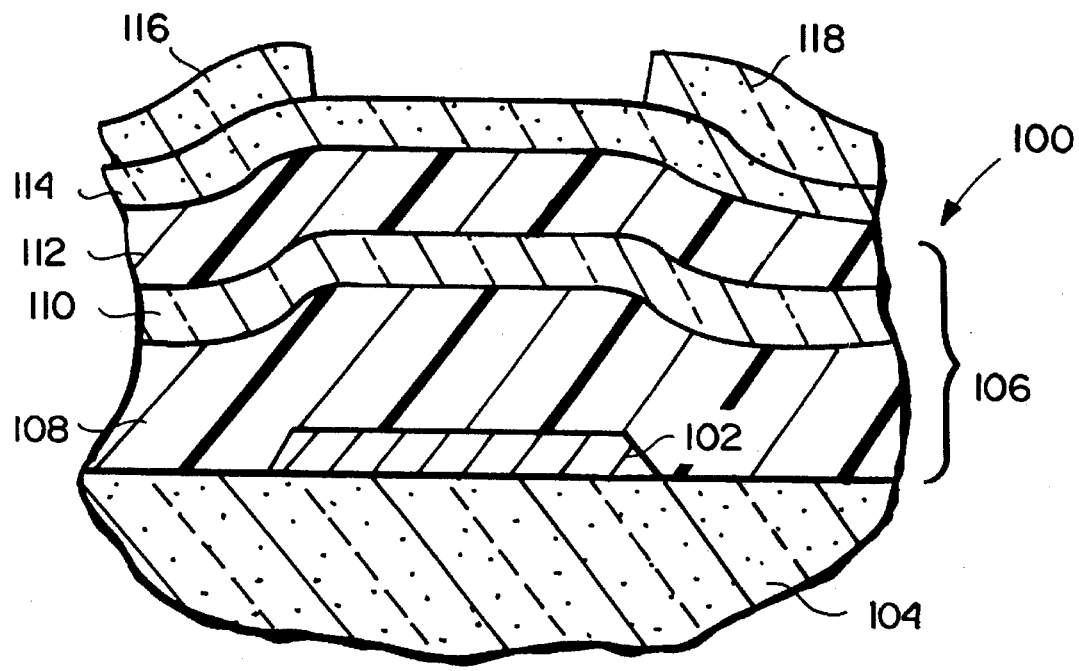
FIG. 2 is a cross-sectional view of a TFT having an ONO insulator according to a second (inverted) embodiment of the invention.

FIG. 2 shows an inverted-type TFT 100 according to a second embodiment of the invention. TFT 100 comprises gate electrode 102 formed on a substrate 104. Overlying substrate 104 and gate electrode 102 is ONO insulator structure 106 which comprises gate oxide layer 108, nitride layer 110, and interfacial oxide layer 112. Polycrystalline silicon semiconductor layer 114 overlies interfacial oxide layer 112. Source region 116 and drain region 118 are formed on polycrystalline semiconductor layer 114.

Fabrication of TFT 100 of FIG. 2 begins with formation of gate electrode 102 on substrate 104 according to conventional techniques. Then, in accordance with the present invention, ONO insulator structure 106 is formed by depositing the three layers 108, 110, and 112 in accordance with the parameters set forth in TABLE I. Following deposition of the ONO insulator structure 106, polycrystalline silicon layer 114 is formed, after which source region 116 and drain region 118 are formed on polycrystalline silicon layer 114.

Instead of having a single gate oxide of essentially fixed characteristics, the TFTs of the present invention provide a multilayer insulator structure out of two elements (an oxide and a nitride) having different properties with respect to strain. By controlling a ratio of nitride thickness to the interfacial oxide thickness, a strain field at the interface can be controlled. Moreover, in contrast to semiconductor memories, interfacial oxide layers of the present invention are deposited sufficiently thick so that no tunneling through to the nitride layer is normally available. The TFTs of the present invention have a ratio of oxide to nitride thickness that precludes electron trap formation at the interface of the polycrystalline silicon and the interfacial oxide.

While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. A method of forming a thin film transistor, the method comprising the steps of:

forming a source region and a drain region in a polycrystalline silicon semiconductor layer, the polycrystalline silicon semiconductor layer being provided on a substrate;

forming an ONO insulator structure on the polycrystalline silicon semiconductor layer;

forming a gate electrode on the ONO insulator structure;

wherein the step of forming the ONO insulator layer comprises;

forming an interfacial oxide layer on the polycrystalline silicon layer;

forming a nitride layer which is thinner than the interfacial oxide layer on the interfacial oxide layer;

forming a cap oxide layer which is thicker than the interfacial oxide layer on the nitride layer by a chemical vapor deposition method.

2. The method of claim 1, wherein the interfacial oxide layer is $SiO_2$, the cap oxide layer is $SiO_2$, and the nitride layer is $Si_3N_4$.

3. The method of claim 1, wherein the interfacial oxide layer and the nitride layer are formed to have a thickness ratio to preclude electron trap formation at the interface of the polycrystalline silicon and the interfacial oxide.

4. The method of claim 1, wherein the interfacial oxide layer, and the nitride layer are formed to have a thickness ratio of 2:1.

5. The method of claim 1, wherein the interfacial oxide layer, the nitride layer, and the cap oxide layer are formed to have a thickness ratio of 10:5:85.

6. A method of forming a thin film transistor, the method comprising the steps of:

forming a gate electrode on a substrate;

forming an ONO insulator structure on the gate electrode;

forming a polycrystalline silicon semiconductor layer on the ONO insulator structure;

forming a source region and a drain region on the polycrystalline silicon semiconductor layer;

forming a gate electrode on the ONO insulator structure;

wherein the step of forming the ONO insulator layer comprises:

forming a gate oxide layer on the gate electrode;

forming a nitride layer on the gate oxide layer;

forming an interfacial oxide layer on the nitride layer;

wherein the nitride layer is thinner than the interfacial oxide layer, wherein the gate oxide layer is thicker than the interfacial oxide layer, and wherein the gate oxide layer is formed by a chemical vapor deposition method.

7. The method of claim 6, wherein the interfacial oxide layer is $SiO_2$, the cap oxide layer is $SiO_2$, and the nitride layer is $Si_3N_4$.

8. The method of claim 6, wherein the interfacial oxide layer and the nitride layer are formed to have a thickness ratio to preclude electron trap formation at the interface of the polycrystalline silicon and the interfacial oxide.

9. The method of claim 6, wherein the interfacial oxide layer, and the nitride layer are formed to have a thickness ratio of 2:1.

10. The method of claim 6, wherein the interfacial oxide layer, the nitride layer, and the cap oxide layer are formed to have a thickness ratio of 10:5:85.

* * * * *